(12) United States Patent
Scheuerlein

(10) Patent No.: US 7,426,128 B2
(45) Date of Patent: Sep. 16, 2008

(54) SWITCHABLE RESISTIVE MEMORY WITH OPPOSITE POLARITY WRITE PULSES

(75) Inventor: Roy E Scheuerlein, Cupertino, CA (US)

(73) Assignee: Sandisk 3D LLC, Sunnyvale, CA (US)

( * ) Notice: Subject to any disclaimer, the term of this patent is extended or adjusted under 35 U.S.C. 154(b) by 320 days.

(21) Appl. No.: 11/179,122

(22) Filed: Jul. 11, 2005

(65) Prior Publication Data
US 2007/0008773 A1   Jan. 11, 2007

(51) Int. Cl.
*G11C 5/06* (2006.01)

(52) U.S. Cl. .................. 365/63; 365/148; 365/163

(58) Field of Classification Search ......... 365/148, 365/161, 163, 63
See application file for complete search history.

(56) References Cited

U.S. PATENT DOCUMENTS

| | | | | |
|---|---|---|---|---|
| 5,541,869 | A * | 7/1996 | Rose et al. | 365/100 |
| 5,915,167 | A * | 6/1999 | Leedy | 438/108 |
| 6,072,716 | A * | 6/2000 | Jacobson et al. | 365/163 |
| 6,473,332 | B1 * | 10/2002 | Ignatiev et al. | 365/148 |
| 6,713,371 | B1 * | 3/2004 | Gu | 438/488 |
| 6,879,505 | B2 * | 4/2005 | Scheuerlein | 365/51 |
| 6,881,623 | B2 * | 4/2005 | Campbell et al. | 438/257 |
| 6,881,994 | B2 * | 4/2005 | Lee et al. | 257/296 |
| 6,995,999 | B2 * | 2/2006 | Morimoto | 365/148 |
| 7,005,350 | B2 * | 2/2006 | Walker et al. | 438/268 |
| 7,145,791 | B2 * | 12/2006 | Tsushima et al. | 365/148 |
| 7,172,840 | B2 * | 2/2007 | Chen | 430/5 |
| 7,195,992 | B2 * | 3/2007 | Gu et al. | 438/487 |
| 7,233,024 | B2 * | 6/2007 | Scheuerlein et al. | 257/74 |
| 7,251,157 | B2 * | 7/2007 | Osada et al. | 365/163 |
| 2003/0047765 | A1 * | 3/2003 | Campbell et al. | 257/298 |
| 2004/0041761 | A1 | 3/2004 | Sugita et al. | |
| 2004/0159828 | A1 * | 8/2004 | Rinerson et al. | 257/2 |
| 2005/0221200 | A1 * | 10/2005 | Chen et al. | 430/5 |
| 2006/0250836 | A1 * | 11/2006 | Herner et al. | 365/148 |

(Continued)

FOREIGN PATENT DOCUMENTS

EP    1 441 361    7/2004

(Continued)

OTHER PUBLICATIONS

Boolchand et al., "Mobile Silver Ions and Glass Formation in Solid Electrolytes." Apr. 26, 2000. Nature, vol. 410, pp. 1070-1073.*

(Continued)

*Primary Examiner*—VanThu Nguyen
*Assistant Examiner*—Alexander Sofocleous
(74) *Attorney, Agent, or Firm*—Foley & Lardner LLP

(57) ABSTRACT

A rewriteable nonvolatile memory includes a thin film transistor and a switchable resistor memory element in series. The switchable resistor element decreases resistance when subjected to a set voltage magnitude applied in a first direction, and increases resistance when subjected to a reset voltage magnitude applied in a second direction opposite the first. The memory cell is formed in an array, such as a monolithic three dimensional memory array in which multiple memory levels are formed above a single substrate. The thin film transistor and a switchable resistor memory element are electrically disposed between a data line and a reference line which are parallel. A select line extending perpendicular to the data line and the reference line controls the transistor.

31 Claims, 13 Drawing Sheets

U.S. PATENT DOCUMENTS

| | | |
|---|---|---|
| 2006/0273298 A1* | 12/2006 | Petti .......................... 257/5 |
| 2006/0285422 A1 | 12/2006 | Scheuerlein |
| 2006/0285423 A1 | 12/2006 | Scheuerlein |
| 2007/0007579 A1 | 1/2007 | Scheuerlein |
| 2007/0008785 A1 | 1/2007 | Scheuerlein |
| 2007/0008786 A1 | 1/2007 | Scheuerlein |

OTHER PUBLICATIONS

Zuang, et al., "Novel Colossal Magnetoresistive Thin Film Nonvolatile Resistance Random Access Memory (RRAM)", International Electron Devices Meeting 2002. IEDM. Technical Digest. San Francisco, CA, Dec. 8-11, 2002, New York, NY : IEEE, US, Dec. 8, 2002, pp. 193-196, XP010626021 ISBN: 0-7803-7462-2, Fig. 4.

* cited by examiner

SWITCHABLE RESISTIVE MEMORY WITH OPPOSITE POLARITY WRITE PULSES

RELATED APPLICATION

This application is related to Scheuerlein, U.S. application Ser. No. 11/179,095, "Memory Cell Comprising a Thin Film Three-Terminal Switching Device Having a Metal Source and/or Drain Region," hereinafter the '095 application; to Scheuerlein, U.S. application Ser. No. 11/179,123, "Apparatus and Method for Reading an Array of Nonvolatile Memory," hereinafter the '123 application; and to Scheuerlein, U.S. application Ser. No. 11/179,077, "Apparatus and Method for Programming an Array of Nonvolatile Memory," hereinafter the '077 application, all assigned to the assignee of the present invention, filed on even date herewith and hereby incorporated by reference in their entirety.

BACKGROUND OF THE INVENTION

The invention relates to a nonvolatile memory cell.

There are materials that have at least two distinct stable resistivity states. This class of materials can be switched from a high-resistivity state to a low-resistivity state by applying a voltage magnitude across the material in a first direction. To switch the material from the low-resistivity state back to a high-resistivity state, the voltage magnitude can be reversed.

Some of these materials can be switched between resistivity states at relatively low applied voltages, for example two volts or less, and preferably one volt or less. These properties would make these materials attractive for use in nonvolatile memory arrays, which retain their memory state even when power is removed from the device. Low-voltage switching is advantageous to reduce power consumption in devices, but many challenges must be overcome to provide the low voltages and reversible voltages required to operate cells incorporating such material, and to avoid accidental change of state during read or during the writing of other cells in a large array of cells.

SUMMARY OF THE PREFERRED EMBODIMENTS

The present invention is defined by the following claims, and nothing in this section should be taken as a limitation on those claims. In general, the invention is directed to a nonvolatile memory cell adapted for use in a rewriteable memory array.

A first aspect of the invention provides for a nonvolatile memory cell comprising a switchable resistor memory element; and a thin film transistor having a channel region, wherein the switchable resistor memory element is disposed in series with the thin film transistor, wherein the switchable resistor memory element decreases resistance when a set voltage magnitude is applied across the resistive memory element, and wherein the switchable resistor memory element increases resistance when an reset voltage magnitude is applied across the switchable resistor memory element, and wherein the polarity of the set voltage magnitude is opposite the polarity of the reset voltage magnitude.

Another aspect of the invention provides for a nonvolatile memory cell comprising a switchable resistor memory element; and a transistor comprising a channel region, the switchable resistor memory element and the transistor arranged in series, wherein the transistor is electrically connected between a data line and a reference line, both data line and reference line extending in a first direction, wherein, when the transistor is on, current flows through the channel region in a second direction, the second direction substantially perpendicular to the first direction, wherein the switchable resistor memory element decreases resistance when subjected to a set voltage magnitude and increases resistance when subjected to a reset voltage magnitude, and wherein polarity of the set voltage magnitude and the reset voltage magnitude are opposite.

A related aspect of the invention provides for a nonvolatile memory cell formed above a substrate, the memory cell comprising a thin film transistor comprising a channel region, the channel region comprising a deposited semiconductor material, wherein the semiconductor material is silicon, germanium or a silicon-germanium alloy; and a switchable resistor memory element, wherein the switchable resistor memory element decreases resistance when subjected to a set voltage magnitude and increases resistance when subjected to a reset voltage magnitude, and wherein polarity of the set voltage magnitude and the reset voltage magnitude are opposite.

Yet another aspect of the invention provides for a monolithic three dimensional memory array comprising a) a first memory level formed above a substrate, the first memory level comprising a first plurality of memory cells, each first memory cell comprising: i) a field effect transistor; and ii) a switchable resistor memory element, wherein the switchable resistor memory element decreases resistance when subjected to a set voltage magnitude and increases resistance when subjected to a reset voltage magnitude, and wherein polarity of the set voltage magnitude and the reset voltage magnitude are opposite; and b) a second memory level monolithically formed above the first memory level.

A preferred embodiment of the invention calls for a monolithic three dimensional memory array comprising a first plurality of substantially parallel, substantially coplanar lines extending in a first direction; a second plurality of substantially parallel, substantially coplanar lines extending in a second direction; a first plurality of switchable resistor memory elements, each switchable resistor memory element disposed electrically between one of the first lines and one of the second lines, the first switchable resistor memory elements at a first height above a substrate; and a second plurality of switchable resistor memory elements, the second switchable resistor memory elements at a second height above the first height, wherein the switchable resistor memory elements decrease resistance when subjected to a set voltage magnitude and increase resistance when subjected to a reset voltage magnitude, and wherein polarity of the set voltage magnitude and the reset voltage magnitude are opposite.

Yet another aspect of the invention provides for a method for forming, setting and resetting a nonvolatile memory cell and associated conductors, the method comprising forming a first data line extending in a first direction; forming a first reference line extending in the first direction; forming a thin film transistor having a channel region, the channel region disposed electrically between the first data line and the first reference line; forming a switchable resistor memory element disposed between the channel region and the data line, the switchable resistor memory element having a first resistance; forming a first select line extending in a second direction different from the first direction; applying a set voltage magnitude across the switchable resistor memory element wherein, after application of the set voltage magnitude, the resistive switching memory element has a second resistance lower than the first resistance; and applying a reset voltage magnitude across the switchable resistor memory element wherein, after application of the reset voltage magnitude, the switchable resistor memory element has a third resistance higher than the second resistance, and wherein the polarity of the set voltage magnitude and the reset voltage magnitude are opposite.

Each of the aspects and embodiments of the invention described herein can be used alone or in combination with one another.

The preferred aspects and embodiments will now be described with reference to the attached drawings.

BRIEF DESCRIPTION OF THE DRAWINGS

FIGS. 3a and 3c are cross-sectional views, while FIG. 3b is a plan view.

FIGS. 5c and 5j are plan views, while the remainder are cross-sectional views.

FIG. 7a is a cross-sectional view illustrating two memory levels sharing data lines according to a preferred embodiment, while

DETAILED DESCRIPTION OF THE PREFERRED EMBODIMENTS

Figure 1A:
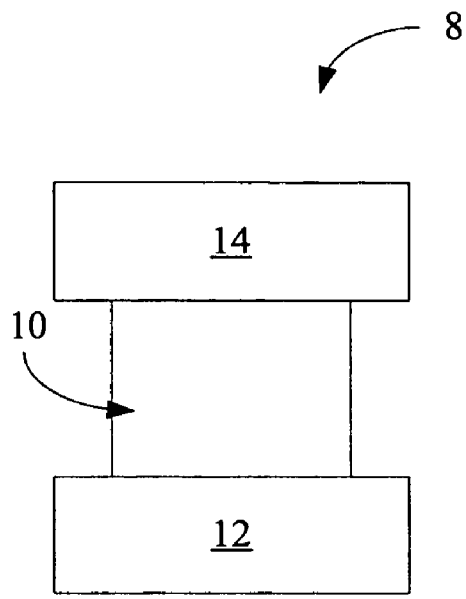
FIG. 1a-1d are cross-sectional views illustrating formation and dissolution of a conductive bridge in a switchable resistor memory element for use in a memory cell formed according to a preferred embodiment of the present invention.

It has been noted that some materials can be reversibly switched between more than one stable resistivity state, for example between a high-resistivity state and a low-resistivity state. The conversion from a high-resistivity state to a low-resistivity state will be called the set conversion, while the conversion from a low-resistivity state to a high-resistivity state will be called the reset conversion. Petti, U.S. patent application Ser. No. 11/143,269, "Rewriteable Memory Cell Comprising a Transistor and Resistance-Switching Material in Series," filed Jun. 2, 2005, owned by the assignee of the present invention and hereby incorporated by reference, describes a monolithic three dimensional memory array comprising transistors and resistance-switching memory elements, wherein setting and resetting can be performed with the same voltage polarity on the resistance-switching memory element. The resistance-switching memory elements of Petti require relatively large voltages (2-3 volts, for example) and currents for either the set or the reset conversion.

For certain materials, in contrast to those preferred in Petti, the conversion from a high-resistivity state to low-resistivity state is affected by applying a voltage of a certain magnitude, called a set voltage magnitude, in one direction, while the reverse conversion, from a low-resistivity state to a high resistivity state, is affected by applying a voltage magnitude, called a reset voltage magnitude, in the opposite direction. These materials thus are bi-directional. One such material is amorphous silicon doped with V, Co, Ni, Pd, Fe or Mn (these materials are described more fully in Rose et al., U.S. Pat. No. 5,541,869.) Another class of material is taught by Ignatiev et al. in U.S. Pat. No. 6,473,332 these are perovskite materials such as $Pr_{1-X}Ca_XMnO_3$, $La_{1-X}Ca_XMnO_3$ (LCMO), LaSrMnO$_3$ (LSMO), or GdBaCo$_X$O$_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716.

A preferred material is taught by Campbell et al. in U.S. patent application Ser. No. 09/943190, and by Campbell in U.S. patent application Ser. No. 09/941544. This materials is doped chalcogenide glass of the formula $A_XB_Y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. As will be described, in the present invention this chalcogenide glass (amorphous chalcogenide, not in as crystalline state) is formed in a memory cell adjacent to a reservoir of mobile metal ions. Some other solid electrolyte material could substitute for chalcogenide glass.

FIG. 1a shows a switchable resistor memory element 8 including chalcogenide layer 10 located between two electrodes. Chalcogenide layer 10 is amorphous, and is high-resistivity as formed, so switchable resistor memory element 8 is in a high-resistance state. Electrode 12 is a source of mobile metal ions, preferably silver. Electrode 14 is any conductor which will not readily provide mobile metal ions, for example tungsten, aluminum, nickel, platinum, or heavily doped semiconductor material.

Figure 1B:
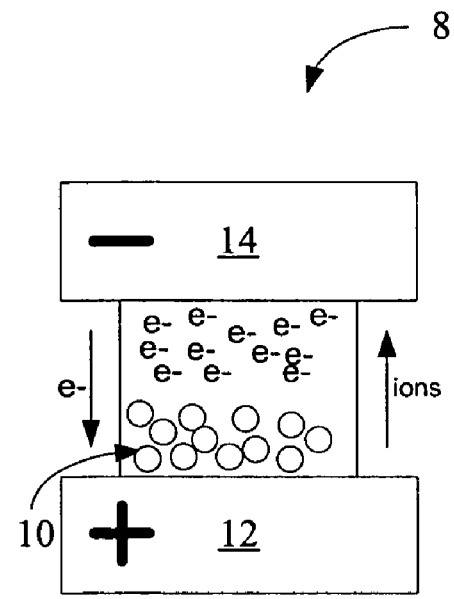
Figure 1C:
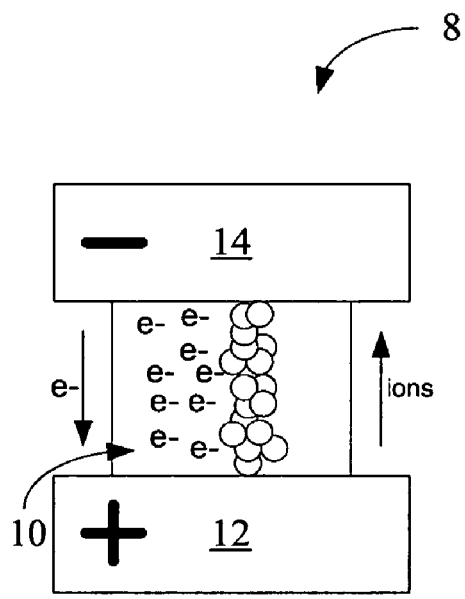

Turning to FIG. 1b, when a positive voltage is applied to silver electrode 12 and a negative voltage to electrode 14, electrons flow toward electrode 12, while silver ions (shown as small circles) migrate from electrode 12 into chalcogenide layer 10. As shown in FIG. 1c, the silver forms a conductive bridge across chalcogenide layer 10, and switchable resistor memory element 8 is in a low-resistance state. The memory cell including switchable resistor memory element 8 has been set, or converted to a low-resistance state. The difference in resistance between the low-resistance and high-resistance states of switchable resistor memory element 8 is readily and repeatably detectable, and in this way a memory state (data "0" or data "1", for example) can be stored and read.

Figure 1D:
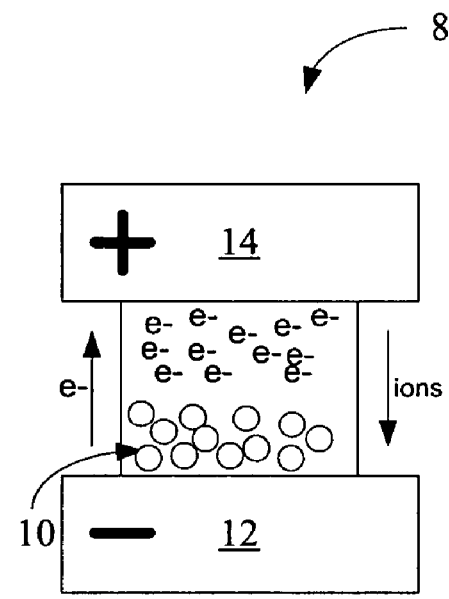

Referring to FIG. 1d, to reset the memory cell, the voltage is reversed. A negative voltage is applied to electrode 12 and a positive voltage to electrode 14. Electrons flow toward electrode 14, the silver in chalcogenide layer 12 is oxidized, and silver ions migrate back into electrode 12, breaking the conductive bridge, leaving chalcogenide layer 12 once again high-resistance. This set and reset cycle can be repeated many times.

It is important to carefully control the circuit conditions experienced by each cell during read, set, and reset. If, during set, too little current is used to form the conductive bridge, the cell will not be highly conductive, and the difference between the programmed and unprogrammed state will be difficult to detect. If too much current is applied, the conductive bridge formed across the chalcogenide layer becomes so conductive that when a reset is attempted, the resistance of the conductive bridge is too low (the current is too high) to allow enough voltage to build up to cause the silver in the bridge to oxidize and to migrate back to electrode 12.

During a read operation, voltage must be applied across the cell to detect current flow and hence the resistance of the switchable resistor memory element, and from the resistance to determine the corresponding data state of the memory cell. If too much voltage is applied, however, there is danger that an undesired high-to-low-resistance or low-to-high-resistance conversion will inadvertently be triggered.

When many cells including such switchable resistor memory elements are included in a large memory array, control of the voltages experienced by each cell becomes more difficult. The present invention describes a nonvolatile memory cell that stores a data state in the state of a switchable resistor memory element, wherein the switchable resistor memory element decreases resistance when subjected to a set voltage magnitude and increases resistance when subjected to a reset voltage magnitude, and wherein polarity of the set voltage and the reset voltage are opposite. The memory cell of the present invention is adapted to be formed in large arrays, allowing for precise control of voltage conditions on each cell.

A memory cell in a large array may be disturbed when voltage is applied to neighboring cells, for example to a cell on a shared conductor. In arrays such as that taught in, for example, Herner et al., U.S. patent application Ser. No. 11/125,939, "Rewriteable Memory Cell Comprising a Diode and a Resistance-Switching Material," filed May 9, 2005, hereby incorporated by reference, a resistance-switching material is paired with a diode to provide electrical isolation. A diode is not the most advantageous choice to use with materials such as those described herein. The resistance-switching materials of the present invention require bi-directional voltage or current, while a diode is a one-way device. In addition, the relatively low switching voltages of some of the resistance-switching materials used in the present invention are difficult to achieve given the relatively high turn-on voltages associated with conventional diodes.

In the present invention, a bi-directional switchable resistor memory element is paired with a MOSFET. In preferred embodiments, the MOSFET is a thin-film transistor adapted to be formed in a monolithic three dimensional memory array, forming a highly dense memory device. As described in more detail in the related '123 application and '077 application filed on even date herewith, the bias polarities for the read, set, and reset operations are chosen to avoid accidental disturb of the stored memory states during normal operation of the memory and thereby allow the use bi-directional switching resistor elements that switch resistance state at very low voltage in a TFT memory array. In an exemplary embodiment, the set bias is positive and the reset and read bias negative.

Figure 2:
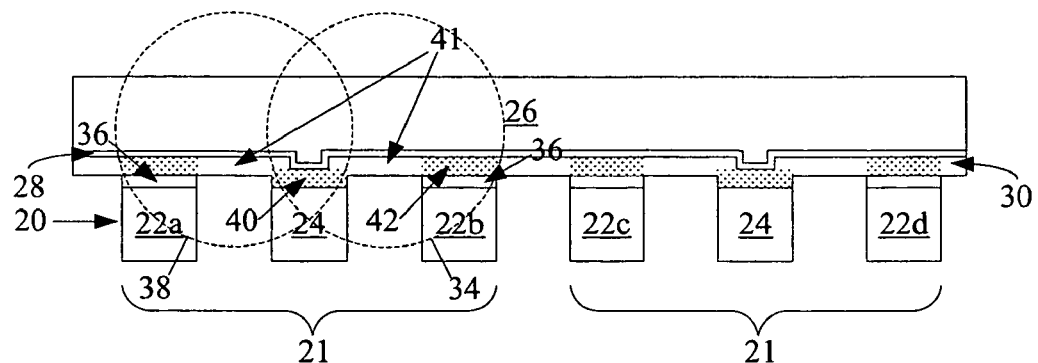
FIG. 2 is a cross-sectional view of a memory level formed according to a preferred embodiment of the present invention.

Two families of embodiments will be described. Turning to FIG. 2, a first embodiment includes memory cells in a TFT array, each having a transistor and a switchable resistor memory element in series. It will be understood that many other embodiments may fall within the scope of the invention. These embodiments are provided for clarity and are not intended to be limiting. Substantially parallel rails 20 (shown in cross section, extending out of the page) include a plurality of line sets 21, each line set 21 consisting of two data lines 22 (22a and 22b, for example) and one reference line 24, reference line 24 immediately adjacent to and between the two data lines 22a and 22b. Above the rails 20 and preferably extending perpendicular to them are substantially parallel select lines 26. Select lines 26 are coextensive with gate dielectric layer 28 and channel layer 30. Transistors are formed between each adjacent data line and reference line pair. Transistor 34 includes channel region 41 between source region 40 and drain region 42. Each select line 26 controls the transistors it is associated with. Switchable resistor memory element 36 is disposed between channel region 41 and data line 22b. In this embodiment, adjacent transistors share a reference line; for example transistor 38 shares a reference line 24 with transistor 34. Transistor 38 also includes a switchable resistor memory element 36 between channel region 41 and data line 22a. No transistor exists between adjacent data lines 22b and 22c. As will be described, in preferred embodiments, a leakage path between data lines 22b and 22c is prevented either by doping channel layer 30 in this region or by removing this section of channel layer 30 using a channel trim masking step.

Figure 3A:
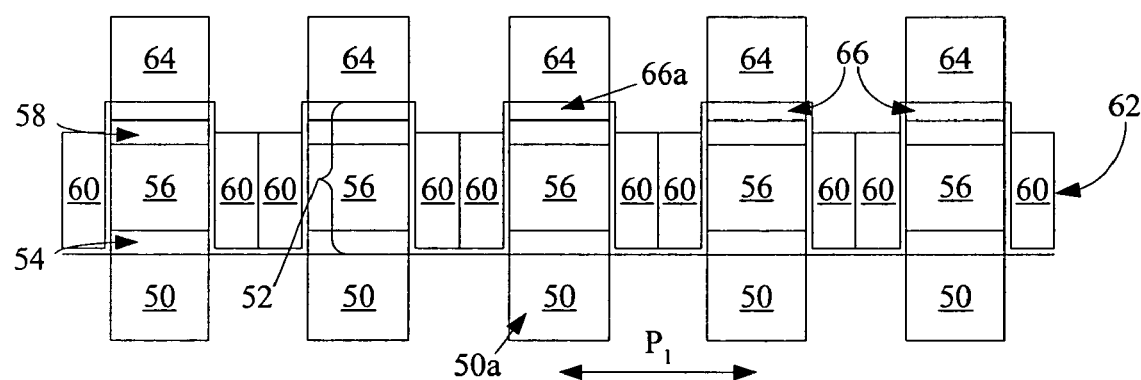
FIGS. 3a, 3b, and 3c are views of a memory level formed according to another preferred embodiment of the present invention.

FIG. 3a is a cross-sectional view of the second embodiment, in which the transistor is oriented substantially vertically. A plurality of substantially parallel data lines 50 is formed. Semiconductor pillars 52 are formed, each above one of the data lines 50. Each pillar 52 includes heavily doped regions 54 and 58 which serve as drain and source regions, and a lightly doped or undoped region 56 which serves as a channel region. In an alternative embodiment, region 56 could also be a stack of a plurality of thin doped semiconductor regions separated by a plurality of thin tunneling dielectric layers. Such a stack is preferred for very low leakage vertical TFT switches. A gate electrode 60 surrounds each pillar 52.

Figure 3B:
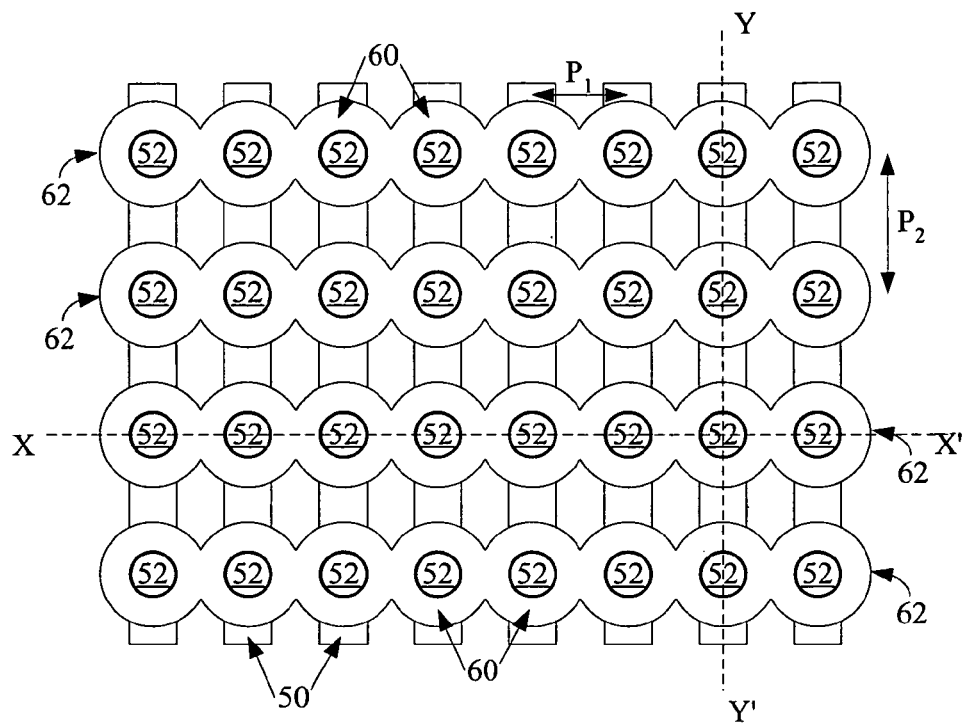
Figure 3C:
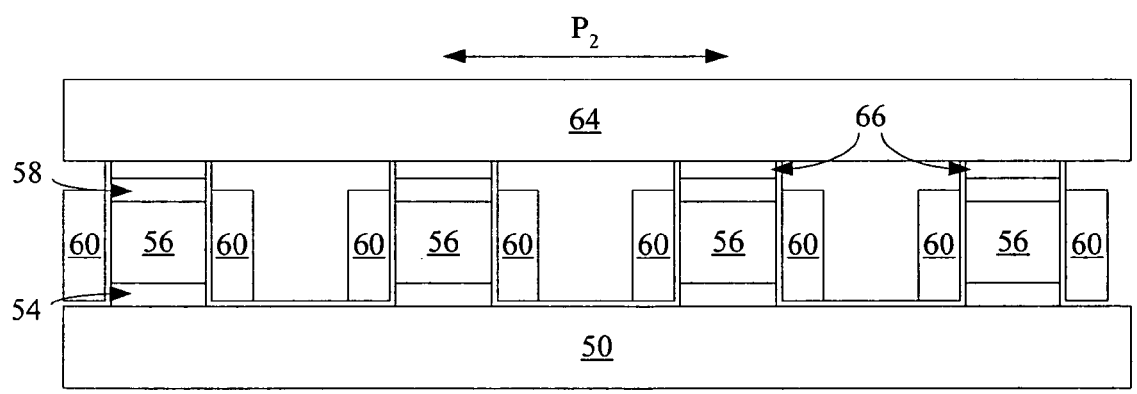

FIG. 3b shows the cells of FIG. 3a viewed from above. In a repeating pattern, pitch is the distance between a feature and the next occurrence of the same feature. For example, the pitch of pillars 52 is the distance between the center of one pillar and the center of the adjacent pillar. In one direction pillars 52 have a first pitch $P_1$, while in other direction, pillars 52 have a larger pitch $P_2$; for example $P_2$ may be 1.5 times larger than $P_1$. (Feature size is the width of the smallest feature or gap formed by photolithography in a device. Stated another way, pitch $P_1$ may be double the feature size, while pitch $P_2$ is three times the feature size.) In the direction having the smaller pitch $P_1$, shown in FIG. 3a, the gate electrodes 60 of adjacent memory cells merge, forming a single select line 62. In the direction having larger pitch $P_2$, gate electrodes 60 of adjacent cells do not merge, and adjacent select lines 62 are isolated. FIG. 3a shows the structure in cross-section along line X-X' of FIG. 3b, while FIG. 3c shows the structure in cross-section along line Y-Y' of FIG. 3b. For readability reference lines 64 are omitted from FIG. 3b.

Referring to FIGS. 3a and 3c, reference lines 64, preferably parallel to data lines 50, are formed above the pillars 52, such that each pillar 52 is vertically disposed between one of the data lines 50 and one of the reference lines 54. A switchable resistor memory element 66 is formed in each memory cell between source region 58 and a reference line 64, for example. Alternatively, a switchable resistor memory element can be formed between drain region 54 and data line 50.

Each memory cell of this embodiment has a vertically oriented transistor having a polycrystalline channel region and a switchable resistor memory element, the two electrically in series. In the embodiment of FIG. 2, in contrast, the overall channel orientation is lateral, not vertical.

Both of these embodiments is based on a nonvolatile memory cell comprising a switchable resistor memory element; and a thin film transistor having a channel region, wherein the switchable resistor memory element is disposed in series with the thin film transistor, wherein the switchable resistor memory element decreases resistance when a set voltage magnitude is applied across the resistive memory element, and wherein the switchable resistor memory element increases resistance when an reset voltage magnitude is applied across the switchable resistor memory element, and wherein the polarity of the set voltage magnitude is opposite the polarity of the reset voltage magnitude. The transistor and switchable resistor memory element are electrically disposed between a data line and a reference line, the reference line substantially parallel to the data line. Specifically, the channel region of the transistor is electrically disposed between the data line and the reference line. In both embodiments, the select line comprises the gate electrodes of the transistors it selects.

For reasons to be described herein, and in the related applications, it is preferred for the thin film transistor of the present invention to have low threshold voltage and high current. Thus, while the channel region of each transistor may be formed of silicon, in preferred embodiments, channel region is germanium or a silicon-germanium alloy.

Lee et al., U.S. Pat. No. 6,881,994, "Monolithic Three Dimensional Array of Charge Storage Devices Containing a Planarized Surface"; and Walker et al., U.S. patent application Ser. No. 10/335,089, "Method for Fabricating Programmable Memory Array Structures Incorporating Series-Connected Transistor Strings," filed Dec. 31, 2002, owned by the assignee of the present invention and hereby incorporated by reference, describe monolithic three dimensional memory arrays in which the memory cells comprise transistors.

Detailed examples will be provided, one describing fabrication of a monolithic three dimensional memory array formed according to the embodiment of FIG. 2, and another describing fabrication of a monolithic three dimensional memory array formed according to the embodiment of FIGS. 3a-3c. Fabrication techniques described in Lee et al., in Walker et al., and in Petti will prove useful during fabrication of memory arrays according to the present invention. For simplicity, not all fabrication details from those applications will be included in the descriptions herein, but it will be understood that no teaching of these incorporated patents and applications is intended to be excluded.

Lateral Transistor Embodiment: Fabrication

Figure 4A:
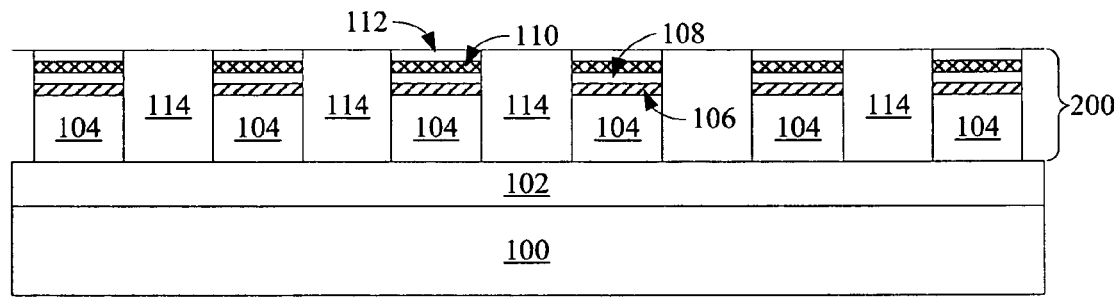
FIGS. 4a-4f are cross-sectional views illustrating stages in formation of a memory level according to a preferred embodiment of the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

Conductive material 104 is deposited on insulating layer 102. Conductive material 104 is of any appropriate conductive material or stack of materials. At least the top portion of conductive material 104 is preferably heavily doped silicon. In preferred embodiments, conductive material 104 is a layer of in situ doped silicon, preferably heavily doped with an n-type dopant such as phosphorus. Conductive material 104 can be any appropriate thickness, for example between about 100 and about 250 nm thick.

Next a reservoir of mobile metal ions 106 is deposited. This layer is between about 1 and about 100 nm thick, preferably between about 10 and about 30 nm thick. Ion reservoir 106 is any material that can provide suitable mobile metal ions, preferably silver ions.

An ion conductor layer 108 is deposited next. Layer 108 is a solid electrolyte material, preferably comprising chalcogenide glass, of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni. Chalcogenide layer 108 is preferably formed in an amorphous state. Layer 108 is in contact with ion reservoir 106.

Note that some chalcogenide memories operate by undergoing phase change between an amorphous and a crystalline state. As described, the memory cells of embodiments of the present invention have a different mechanism, formation and dissolution of a conductive bridge, and should not undergo phase change. Thus chalcogenides that enter the crystalline phase less easily may be preferred.

In other embodiments, other materials that can support formation and dissolution of a conductive bridge may be substituted for a chalcogenide. For simplicity this description will refer to layer 108 as a chalcogenide layer, but it will be understood that other materials can be used instead.

Chalcogenide layer 108 is preferably between about 10 and about 50 nm thick, preferably about 35 nm thick.

Top electrode 110, deposited next, is any appropriate electrode material. This should be a material that will not readily provide mobile metal ions to chalcogenide layer 108 under an electric field. Top electrode 110 can be, for example, tungsten, nickel, molybdenum, platinum, metal silicides, conductive nitrides such as titanium nitride, or heavily doped polysilicon. An electrode that can serve as a diffusion barrier between chalcogenide layer 108 and the channel layer yet to be formed, such as titanium nitride, is preferred. Top electrode 110 is preferably between about 10 and about 50 nm thick.

If top electrode 110 is not formed of heavily doped n-type polysilicon, a thin layer 112 of heavily doped n-type (N+) polysilicon is deposited next. This layer can be in situ doped or doped through ion implantation. Other appropriate barrier layers, adhesion layers, or etch stop layers may be included in addition to the layers described.

Next conductive material 104, ion reservoir 106, chalcogenide layer 108, top electrode 110, and N+ layer 112 are patterned and etched into a plurality of substantially parallel, substantially coplanar lines 200.

Dielectric fill 114, for example HDP oxide, is deposited over and between lines 200, filling gaps between them. The overfill of dielectric fill 114 is removed to expose N+ layer 112 at the tops of lines 200, and a planarizing step, for example by chemical-mechanical planarization (CMP) or etchback, coexposes N+ layers 112 and dielectric fill 114 at a substantially planar surface. The structure at this point is shown in FIG. 4a.

Figure 4B:
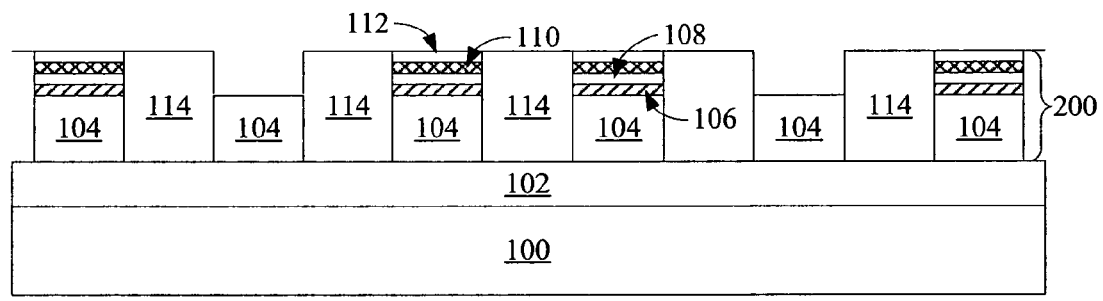

Next, turning to FIG. 4b, a masking step is performed to expose every third line among lines 200, and N+ layer 112, top electrode 110, chalcogenide layer 108, and ion reservoir 106 are etched and removed from the exposed lines only. The exposed lines will be reference lines in the completed array. As shown, layers 112, 110, 108, and 106 remain on the other two of three lines, which will become data lines in the completed array.

Ion reservoir 106, chalcogenide layer 108, and electrode layer 110 form a switchable resistor memory element.

Figure 4C:
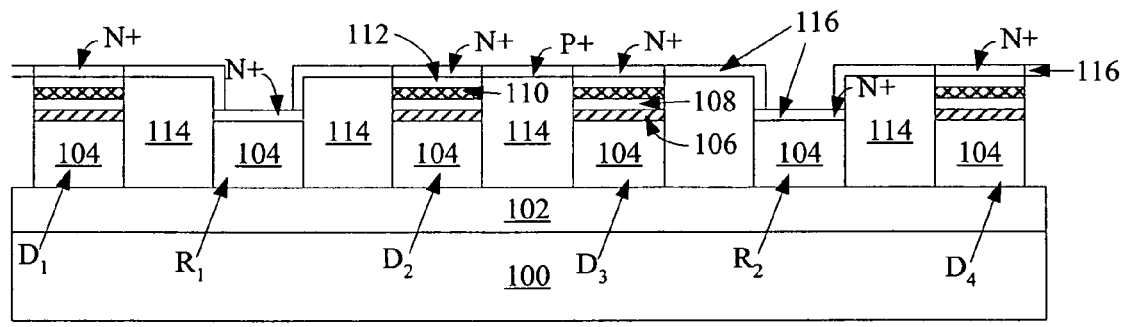

Turning to FIG. 4c, next a channel layer 116 is deposited. This layer is a semiconductor material, preferably lightly doped with a p-type dopant, and is preferably between about 10 and about 50 nm thick. In preferred embodiments, channel layer 116 is between about 10 and about 20 nm thick. Channel layer 116 is a semiconductor material, and can be silicon, germanium, or an alloy of silicon, germanium, or silicon and germanium. In preferred embodiments, channel layer 116 is amorphous as deposited, and will be crystallized in a following anneal step or during subsequent thermal processing, and after recrystallization will be polycrystalline. Methods to maximize grain size in deposited semiconductor channel layers are described in Gu, U.S. Pat. No. 6,713,371, "Large Grain Size Polysilicon Films Formed by Nuclei-Induced Solid Phase Crystallization"; and in Gu et al., U.S. patent application Ser. No. 10/681,509, "Uniform Seeding to Control Grain and Defect Density of Crystallized Silicon for Use in Sub-Micron Thin Film Transistors," both owned by the assignee of the present invention and hereby incorporated by reference.

Note that during subsequent thermal steps, n-type dopant atoms will diffuse up from N+ layers 112 and from N+ material 104 to form N+ regions in channel layer 116, which will behave as source and drain regions in the completed device.

Channel layer 116 is conformal, following the topography over which it is deposited. At the top of reference lines $R_1$ and $R_2$ where layers 112, 110, 108, and 106 were removed, then, channel layer 116 has a corrugated shape. This corrugated shape increases effective channel length, which may improve device performance at very small dimensions.

In the completed array, transistors will be formed between adjacent data lines and reference lines, but there should be no device formed between adjacent data lines, for example between data line $D_2$ and data line $D_3$. Leakage between these lines can be prevented by a masking step and an ion implantation step, implanting a p-type dopant in the channel layer between data line $D_2$ and $D_3$ as shown in FIG. 4c.

Figure 4D:
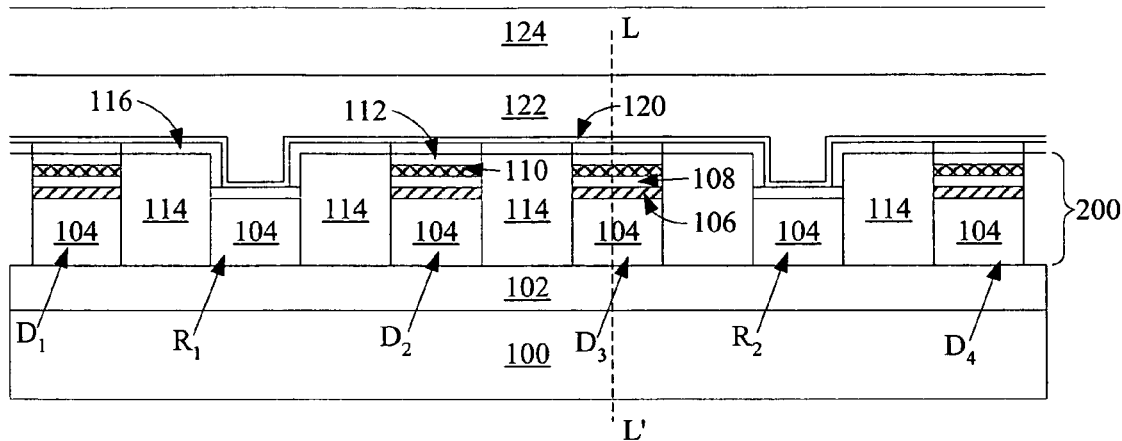
Figure 4E:
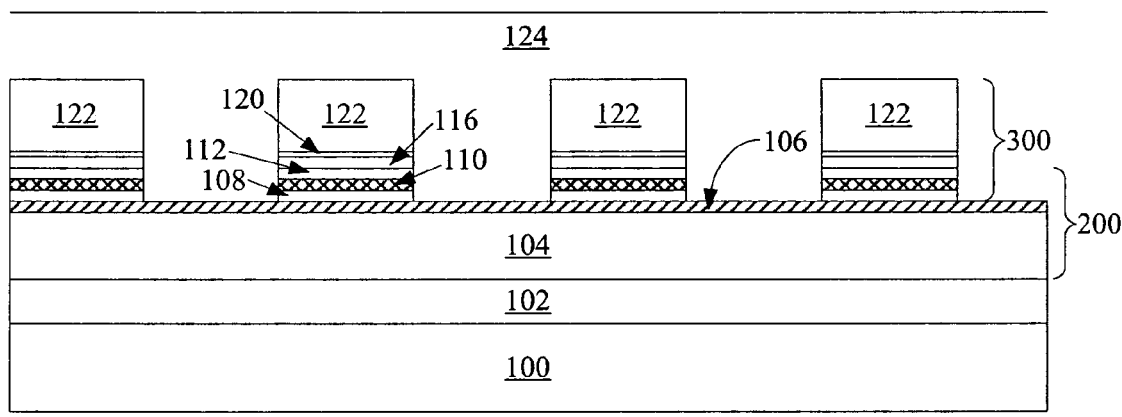
Figure 4F:
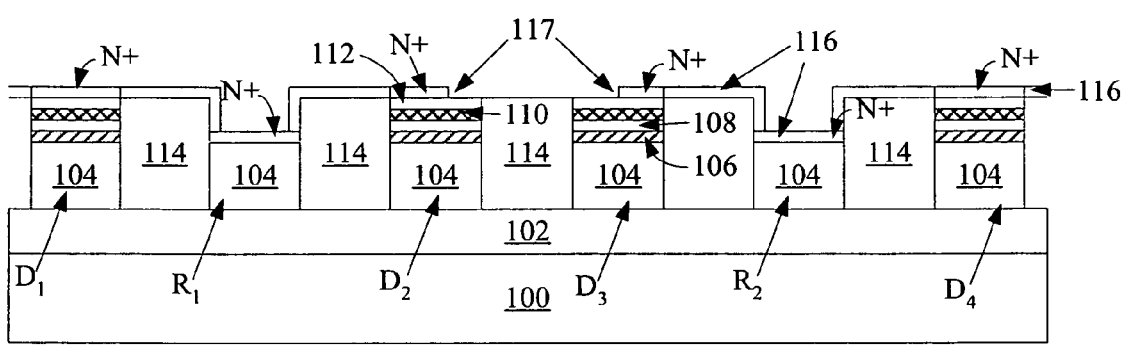

In an alternative embodiment, shown in FIG. 4f, channel layer 116 can be selectively removed in region 117 between data lines $D_2$ and $D_3$ using conventional pattern and etch techniques.

Turning to FIG. 4d, a gate dielectric 120 is formed next. If channel layer 116 is silicon or a silicon-rich alloy, gate dielectric 120 may be a layer of silicon dioxide grown by an oxidation process such as thermal or plasma oxidation. In other embodiments, this layer is a deposited dielectric, for example silicon dioxide or higher-K dielectric materials such as $Si_3N_4$, $Al_2O_3$, $HfO_2$, HfSiON, or $Ta_2O_5$. Gate dielectric layer 120 is preferably between about 2 and about 10 nm. Higher-K dielectric gate dielectrics may be thicker than a gate dielectric formed of silicon dioxide.

Next word line material 122 is deposited. Word line material 122 can be any conductive material, including tungsten, aluminum, or heavily doped semiconductor material, for example polysilicon. In some embodiments, word line material 122 includes a first layer of n-type polysilicon, a thin layer of titanium, a thin layer of titanium nitride, and a second layer of n-type polysilicon. The titanium and titanium nitride will react with the surrounding polysilicon to form a titanium silicide layer, providing lower resistance.

Finally a pattern and etch step is performed to form word lines 300. This etch continues through gate dielectric layer 120, channel layer 116, and through N+ layer 112 and top electrode 110. In preferred embodiments, etching continues through chalcogenide layer 108 as well. Word lines 300 must be fully isolated; chalcogenide layer 108 is typically high-resistance, but in a very large array even the low-conductance paths afforded by remaining chalcogenide material between adjacent word lines may be disadvantageous. Ion reservoir 106 is optionally etched as well. FIG. 4e shows the structure at ninety degrees along line L-L' to the view shown in FIG. 4d after the word line etch is completed.

A dielectric material 124 is deposited over and between word lines 300, filling gaps between them. A planarizing step, for example by CMP, forms a substantially planar surface on an interlevel dielectric formed of dielectric material 124. A first memory level has been formed. Additional memory levels can be formed above this level.

Many variations on the embodiment described here can be imagined. In some embodiments, chalcogenide layer 108 is replaced with amorphous silicon doped with V, Co, Ni, Pd, Fe or Mn, and is sandwiched between appropriate electrode layers. In other embodiments, chalcogenide layer 108 is replaced with one of the perovskite materials named earlier. Any appropriate electrode materials may be used with a perovskite material, for example aluminum, titanium, vanadium, manganese, copper, niobium, zirconium, silver, tin, indium, hafnium, tantalum, or tungsten. A carbon polymer may replace chalcogenide layer 108 in another embodiment.

Note that in the embodiment just described, the data line and the reference line are below the channel region and substantially parallel. In the present embodiment, to convert the switchable resistor memory element of a memory cell from the high-resistance state to the low-resistance state, a first voltage is applied to the data line and a second voltage is applied to the reference line, the first voltage higher than the second voltage. Conversely, to convert the switchable resistor memory element of a memory cell from the low-resistance state to the high-resistance state, a third voltage is applied to the data line and a fourth voltage is applied to the reference line, the fourth voltage higher than the third voltage.

Vertical Transistor Embodiment: Fabrication

Figure 5A:
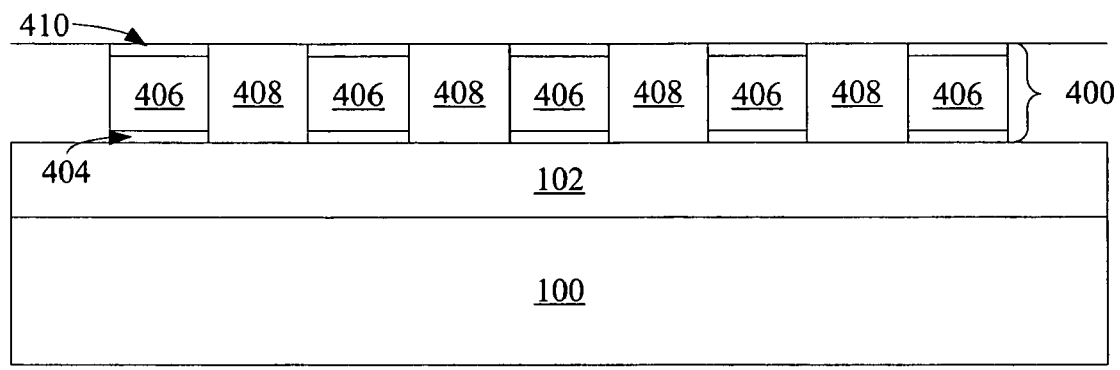
FIGS. 5a-5j are views illustrating stages in formation of a memory level according to another preferred embodiment of the present invention.

Turning to FIG. 5a, as in the prior embodiment, fabrication begins over a suitable substrate 100 and insulating layer 102. As described earlier, substrate 100 may include integrated circuits fabricated therein.

Data lines 400 are formed over the substrate 100 and insulator 102. An adhesion layer 404 may be included between the insulating layer 102 and the conducting layer 406 to help the conducting layer 406 adhere. A preferred material for the adhesion layer 404 is titanium nitride, though other materials may be used, or this layer may be omitted. Adhesion layer 404 can be deposited by any conventional method, for example by sputtering.

The thickness of adhesion layer 404 can range from about 20 to about 500 angstroms, and is preferably between about 10 and about 40 nm, most preferably about 20 nm.

The next layer to be deposited is conducting layer 406. Conducting layer 406 can comprise any conducting material known in the art, such as doped semiconductor material, metals such as tungsten, or conductive metal silicides, or aluminum. The thickness of conducting layer 406 can depend, in part, on the desired sheet resistance and therefore can be any thickness that provides the desired sheet resistance. In one embodiment, the thickness of conducting layer 406 can range from about 50 to about 300 nm, preferably between about 100 and about 200 nm, most preferably about 120 nm.

Another layer 410, preferably of titanium nitride, is deposited on conducting layer 406. It may have thickness comparable to that of layer 404.

Once all the layers that will form the data lines 400 have been deposited, the layers will be patterned and etched using any suitable masking and etching process to form substantially parallel, substantially coplanar data lines 400, shown in FIG. 5a in cross-section.

Next a dielectric material 408 is deposited over and between data lines 400. Dielectric material 408 can be any known electrically insulating material, such as HDP oxide.

Finally, excess dielectric material 408 on top of data lines 400 is removed, exposing the tops of data lines 400 separated by dielectric material 408, and leaving a substantially planar surface. The resulting structure is shown in FIG. 5*a*. This removal of dielectric overfill to form the planar surface can be performed by any process known in the art, such as etchback or CMP.

The width of data lines 400 can be as desired. In preferred embodiments, data lines 200 can have a width between about 20 and about 250 nm, preferably between about 45 and about 90 nm. In preferred embodiments, the gaps between data lines 400 have about the same width as data lines 400, though it may be greater or less. In preferred embodiments, the pitch of data lines 200 is between about 40 nm and about 500 nm, preferably between about 90 nm and about 180 nm.

Figure 5B:
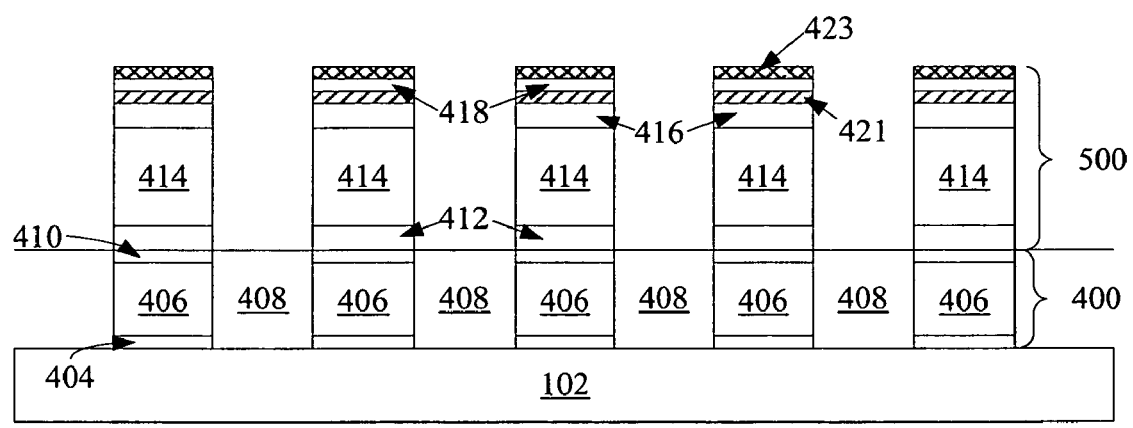

Next, turning to FIG. 5*b*, vertical pillars will be formed above completed data lines 400. (To save space substrate 100 is omitted in FIG. 5*b* and subsequent figures; its presence should be assumed.) Semiconductor material that will be patterned into pillars is deposited. The semiconductor material can be silicon, germanium, or an alloy of silicon, germanium, or silicon and germanium.

In preferred embodiments, the semiconductor pillar comprises a bottom heavily doped region of a first conductivity type, a middle lightly doped or undoped region of a second conductivity type, and a top heavily doped region of the first conductivity type.

In this example, bottom heavily doped region 412 is heavily doped n-type germanium. In a most preferred embodiment, heavily doped region 412 is deposited and doped with an n-type dopant such as phosphorus by any conventional method, preferably by in situ doping, though alternatively through some other method, such as ion implantation. This layer is preferably between about 10 and about 80 nm, most preferably between about 20 and about 30 nm. Bottom heavily doped region 412 will behave as a source or drain region for the transistor to be formed.

Next the germanium that will form the remainder of the pillar, regions 414 and 416, is deposited. The lightly doped region 414 will preferably be between about 60 and about 200 nm thick, preferably between about 90 and about 150 nm thick. The top heavily doped region 416 should be between about 10 and about 50 nm thick, preferably between about 20 and about 30 nm thick. Thus between about 70 and about 200 nm of germanium should be deposited to complete the thickness required for the pillar. This germanium layer 414 is preferably lightly doped p-type germanium, and is preferably in-situ doped. The channel region of the transistor to be formed will be in germanium layer 414.

In some embodiments a subsequent planarization step will remove some germanium, so in this case an extra thickness is deposited. If the planarization step is performed using a conventional CMP method, about 800 angstroms of thickness may be lost (this is an average; the amount varies across the wafer. Depending on the slurry and methods used during CMP, the germanium loss may be more or less.) If the planarization step is performed by an etchback method, only about 40 nm of germanium or less may be removed.

In a preferred embodiment, top heavily doped n-type region 416 is formed at this point by ion implantation. Heavily doped region 416, which will serve as a source/drain region for the transistor to be formed, is preferably between about 20 and about 30 nm thick.

Next a layer 421 of a reservoir of mobile metal ions is deposited. This layer is between about 1 and about 100 nm thick, preferably between about 10 and about 30 nm thick. Ion reservoir 421 is any material that can provide suitable mobile metal ions, preferably silver ions.

A layer 418 of an ion conductor, preferably a chalcogenide (corresponding to chalcogenide layer 108 in the previous embodiment) is deposited on and in contact with ion reservoir 421. The thickness and composition of layer 418 may be as described in the previous embodiment. For simplicity, this discussion will refer to ion conductor layer 418 as a chalcogenide layer, but it will be understood that other materials can be used instead.

Next electrode layer 423 is deposited on chalcogenide layer 418. Layer 423 is any of the materials described for use in the top electrode layer of the previous embodiment.

Next a pattern and etch step is performed to etch pillars 500. Layers 423, 418, 421, 416, 414, and 412 are etched in this etch step.

The pillars 500 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

After etch, pillars 500 include bottom heavily doped region n-type region 412, middle lightly doped p-type region 414, top heavily doped n-type region 416, ion reservoir 421, chalcogenide layer 418, and top electrode 423. In some embodiments other layers, for example barrier layers, may be included.

The photolithography techniques described in Chen, U.S. application Ser. No. 10/728436, "Photomask Features with Interior Nonprinting Window Using Alternating Phase Shifting," filed Dec. 5, 2003; or Chen, U.S. application Ser. No. 10/815312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Figure 5C:
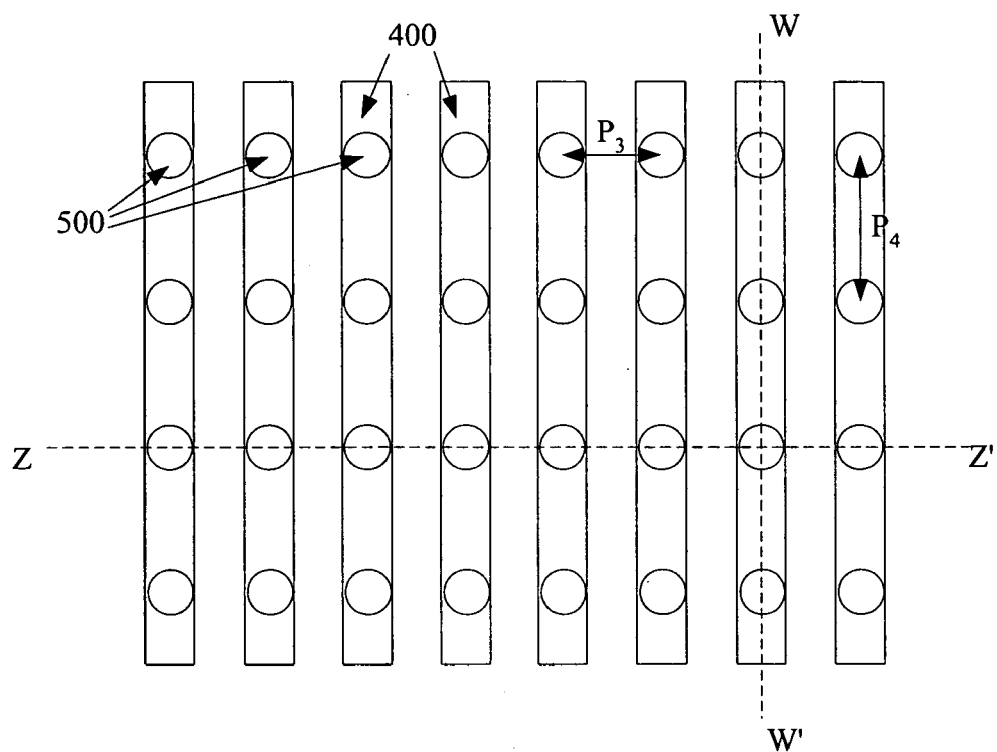

The pillars 500 are preferably about the same width as data lines 400. Turning to FIG. 5*c*, which shows the structure viewed from above, it will be seen that pillars 500 have a first pitch $P_3$ in one direction and a second, larger pitch $P_4$ in the other direction. (Pillars 500 are pictured, in FIG. 5*c*, as substantially cylindrical. At small feature sizes, the photolithographic process tends to round corners; thus independently patterned pillars will tend to be cylindrical.) The views of FIGS. 5*a* and 5*b* show pillars at the smaller pitch $P_3$, along line Z-Z' of FIG. 5*c*. Pitch $P_3$, measured in the direction perpendicular to data lines 400, should be about the same as the pitch of data lines 400 (preferably between about 180 and 360 nm), so that each pillar 500 is on top of one of the data lines 400. Some misalignment can be tolerated. Pitch $P_4$, measured parallel to data lines 400, should be larger than pitch $P_3$, preferably about 1.5 times $P_3$, though if desired it may be larger or smaller.

Figure 5D:
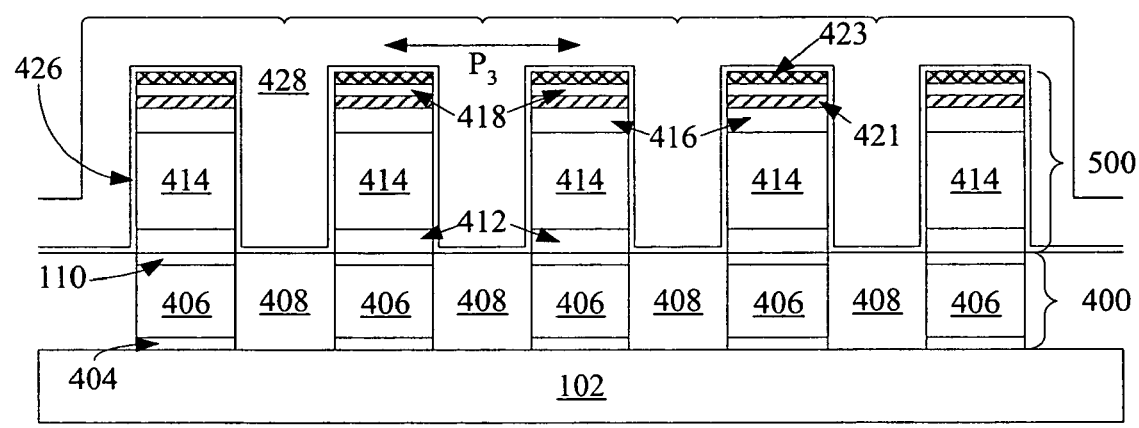

Turning to FIG. 5*d*, a thin gate dielectric layer 426 is conformally deposited over pillars 500, surrounding and in contact with each pillar 500. Gate dielectric layer 426 can be any appropriate material, for example silicon dioxide, and may have any appropriate thickness, for example between about 20 and about 80 angstroms, preferably about 50 angstroms.

Next a gate material layer 428 is deposited over gate dielectric layer 426, over and between first pillars 500. Gate material layer 428 is preferably tantalum nitride, though any other suitable conductive material, for example heavily doped silicon or a metal, can be used instead.

Figure 5E:
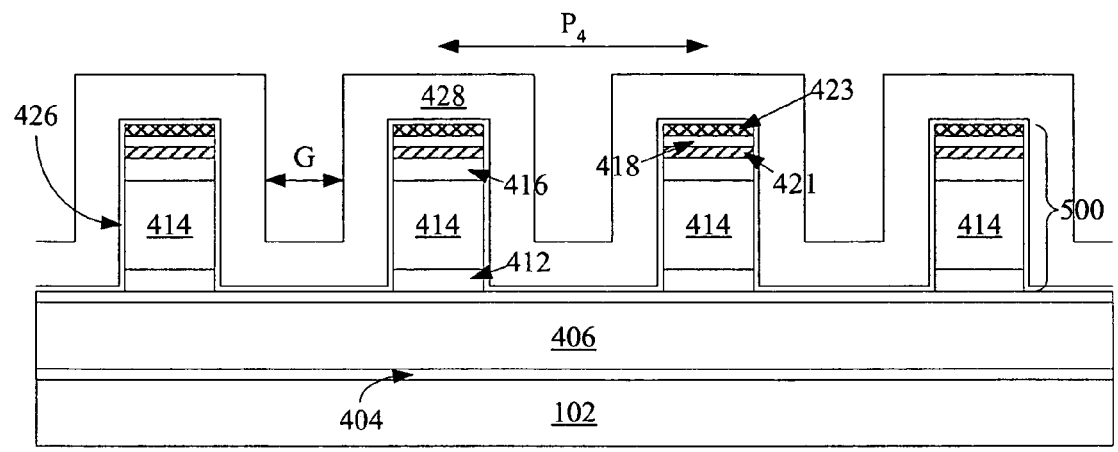

FIG. 5e shows the structure of FIG. 5d viewed at 90 degrees, along line W-W' of FIG. 5c. The thickness of tantalum nitride layer 428 is selected so that the sidewalls merge in one direction (having smaller pitch $P_3$) but not in the other direction (having larger pitch $P_4$). For example, suppose pitch $P_3$ is 180 nm and pitch $P_4$ is 270 nm. Suppose further that the width of pillars 500 is about 90 nm, and the gap between them, in the direction of smaller pitch $P_3$, is about 90 nm; thus the gap between pillars 300 in the $P_4$ pitch direction is 180 nm. A thickness of about 45 nm of tantalum nitride layer 428 will just fill gaps in the $P_3$ pitch direction (shown in FIG. 5d), and will leave a gap G of 90 nm in the $P_4$ pitch direction (shown in FIG. 5e.) Preferably the thickness of tantalum nitride layer 428 is between one-half the width of pillars 500 and about three-quarters the width of pillars 500. Thus if pillars 500 have a width of about 90 nm, the preferred thickness of tantalum nitride layer 428 is between about 45 nm and about 72 nm, preferably about 60 nm. A thickness of 60 nm will leave a gap of about 60 nm in the $P_4$ pitch direction.

Figure 5F:
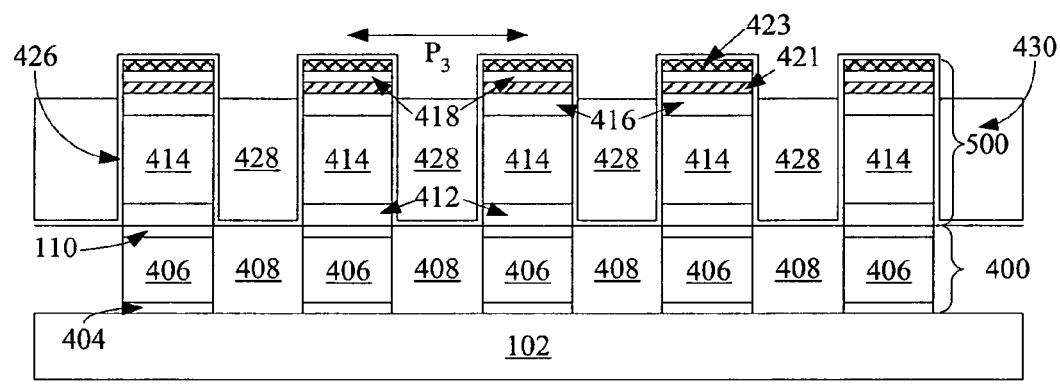
Figure 5G:
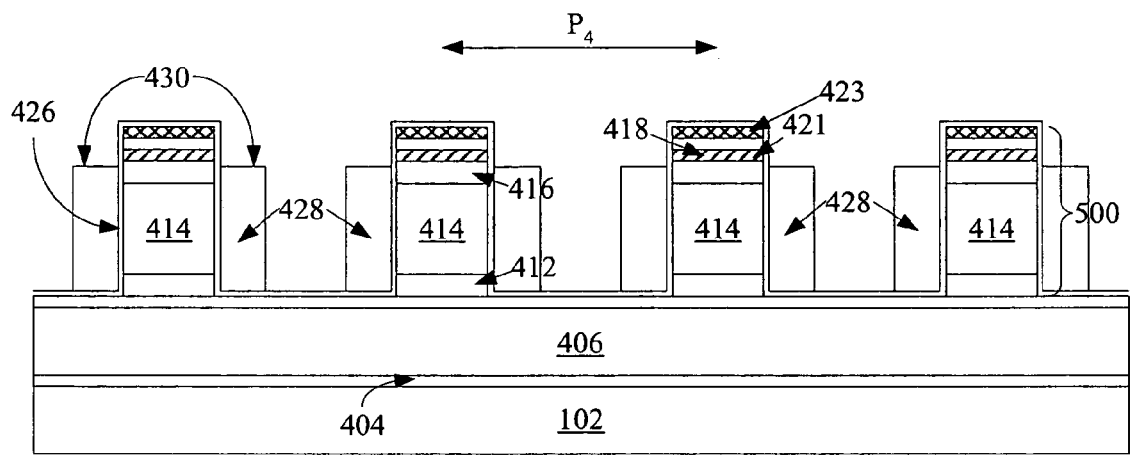

Turning to FIG. 5f, which shows the structure in the $P_3$ pitch direction, and FIG. 5g, which shows the structure in the $P_4$ pitch direction, an etch is performed to recess tantalum nitride layer 428 and to isolate select lines 430. Select lines 430 consist of merged tantalum nitride layer 428 in the $P_3$ pitch direction (FIG. 5f), but should be fully separate in the $P_4$ pitch direction (FIG. 5g). Select lines 430 are substantially parallel and substantially coplanar.

This etch should be a timed etch, and should be carefully controlled. After the etch is complete, tantalum nitride layer 428 is preferably at least 50 nm below the top of top electrode 423. This 50 nm gap will be filled with dielectric, and will serve to isolate select lines 430 from overlying conductors yet to be formed. Tantalum nitride layer 428 should not be etched so far, however, that it fails to reach the lower edge of heavily doped region 416, which will be the source/drain region of the transistor.

Figure 5H:
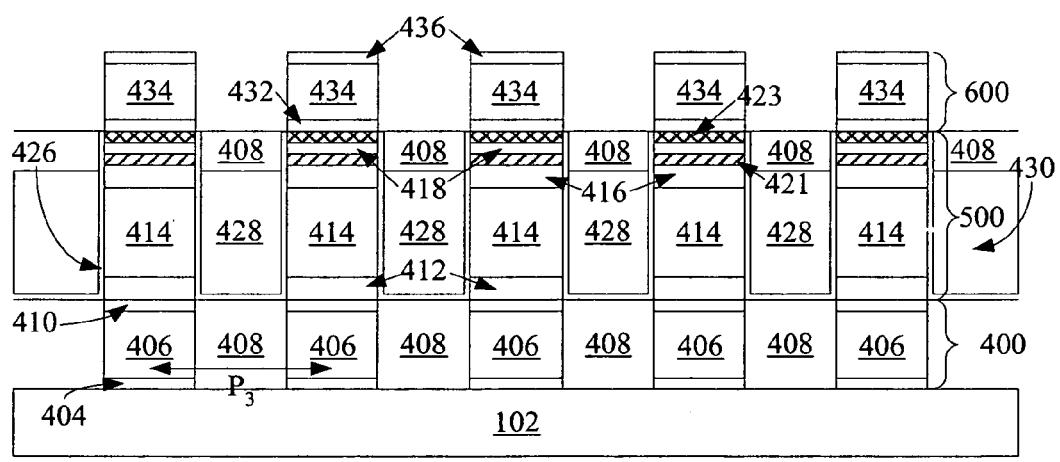
Figure 5I:
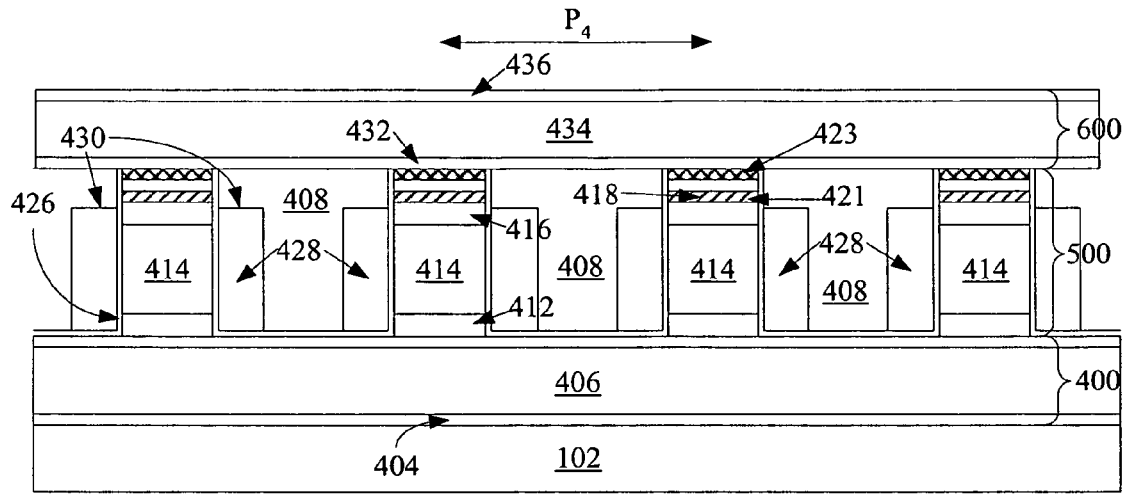

Next, turning to FIGS. 5h and 5i, dielectric material 408 is deposited over and between pillars 500 and tantalum nitride layer 428, filling the gaps between them. Dielectric material 408 can be any known electrically-insulating material, for example HDP oxide.

Next the dielectric material on top of the pillars 500 is removed, exposing top electrodes 423 separated by dielectric material 138. Gate dielectric layer 426 is removed from above top electrode 423 at the same time. This removal of dielectric overfill and planarization can be performed by any process known in the art, such as CMP or etchback.

Substantially parallel, substantially coplanar reference line 600 can be formed by any suitable method. Reference lines 600 can be formed using the methods used to form data lines 400: Deposit titanium nitride layer 432, deposit conductive layer 434, deposit titanium nitride layer 436, then pattern and etch to form reference lines 600. Reference lines 600 are preferably parallel to data lines 400, though, in an alternative embodiment, reference lines 600 could be formed perpendicular to data lines 400 if preferred. A dielectric material (not shown) is deposited over and between reference lines 600. Alternatively, reference lines 600 can be formed by a damascene method. Reference lines 600 preferably have about the same width as data lines 400. The pitch of reference lines should be pitch $P_3$, so that each pillar 500 is vertically disposed between one of the data lines 400 and one of the reference lines 600. Some misalignment can be tolerated.

Alternatively, reference lines 600 can be formed by a damascene method, for example comprising copper. If reference lines 600 are formed by a damascene method, they will be formed by depositing a dielectric material; etching substantially parallel trenches in the dielectric material; depositing a conductive material on the dielectric material, filling the trenches; and planarizing to expose the dielectric material and form the reference lines 600.

Figure 5J:
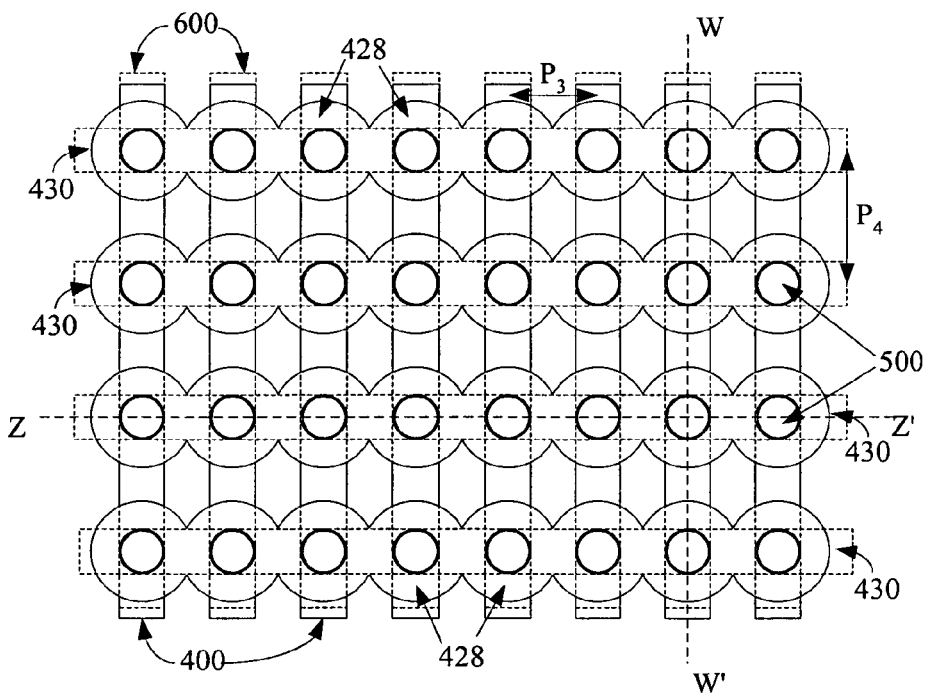

FIG. 5j shows the structure viewed from above. The view of FIG. 5h is along line Z-Z', and the view of FIG. 5i is along line W-W'.

Note that in this embodiment, unlike the prior embodiment, one of the data line and the reference line is below the channel region and the other is above the channel region.

What has been formed in FIGS. 5h and 5i is a first memory level. In each memory cell, tantalum nitride layer 428 serves as a gate electrode. When threshold voltage is applied to gate electrode 428, a vertical conductive channel is formed at the surface of channel region 414, and current may flow between source/drain regions 412 and 416. Each gate electrode is a portion of one of the select lines 430. Ion reservoir 421, chalcogenide layer 418, and top electrode 423 serve as a switchable resistor memory element. Additional memory levels can be formed above this memory level, using the methods described.

Figure 6:
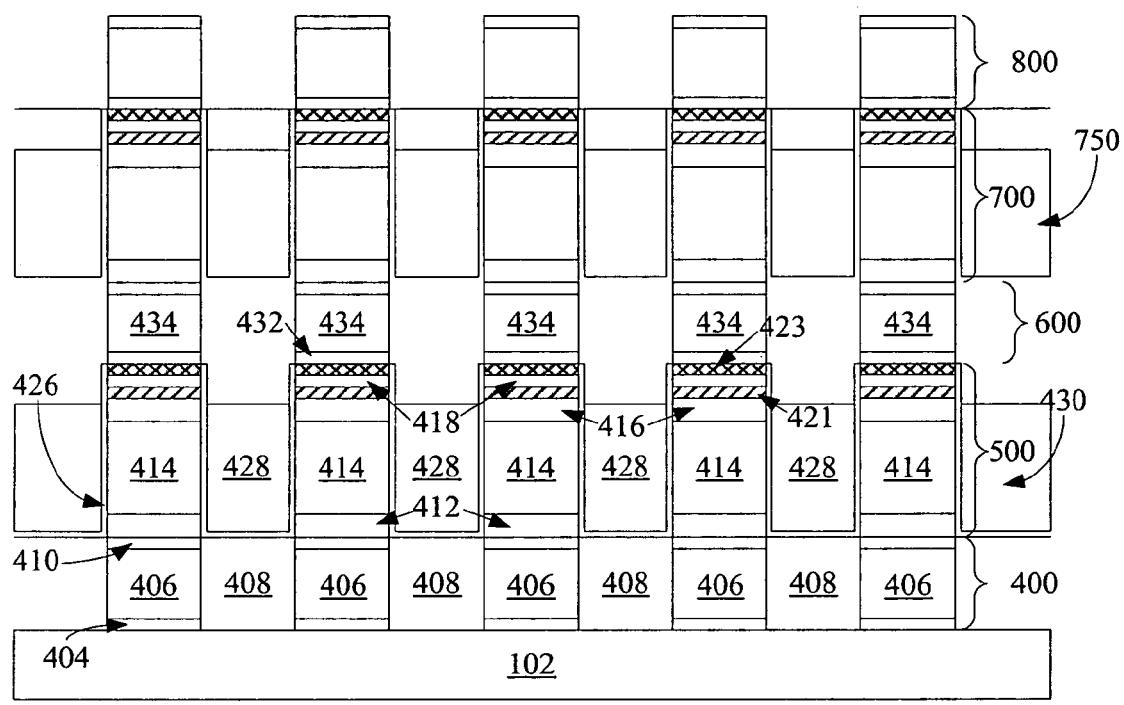
FIG. 6 is a cross-sectional view illustrating two memory levels sharing reference lines according to a preferred embodiment of the present invention.

For example, turning to FIG. 6, after a planarizing step exposes the tops of reference lines 600, second pillars 700, surrounded by gate electrode material merging to form second select lines 750, can be formed on reference lines 600, and second data lines 800 can be formed above second pillars 700. FIG. 6 shows two memory levels sharing reference lines 600.

Figure 7A:
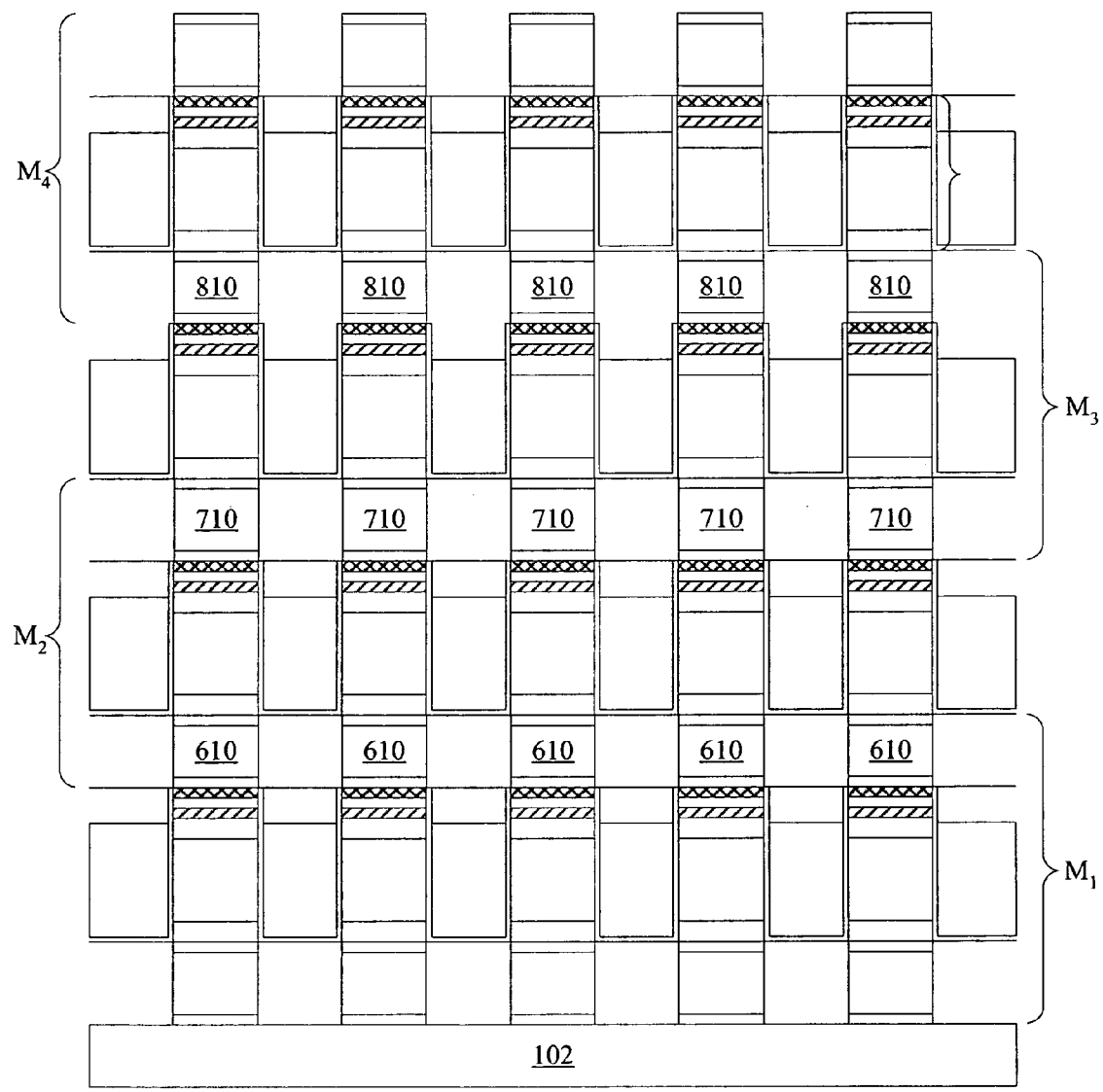
Figure 7B:
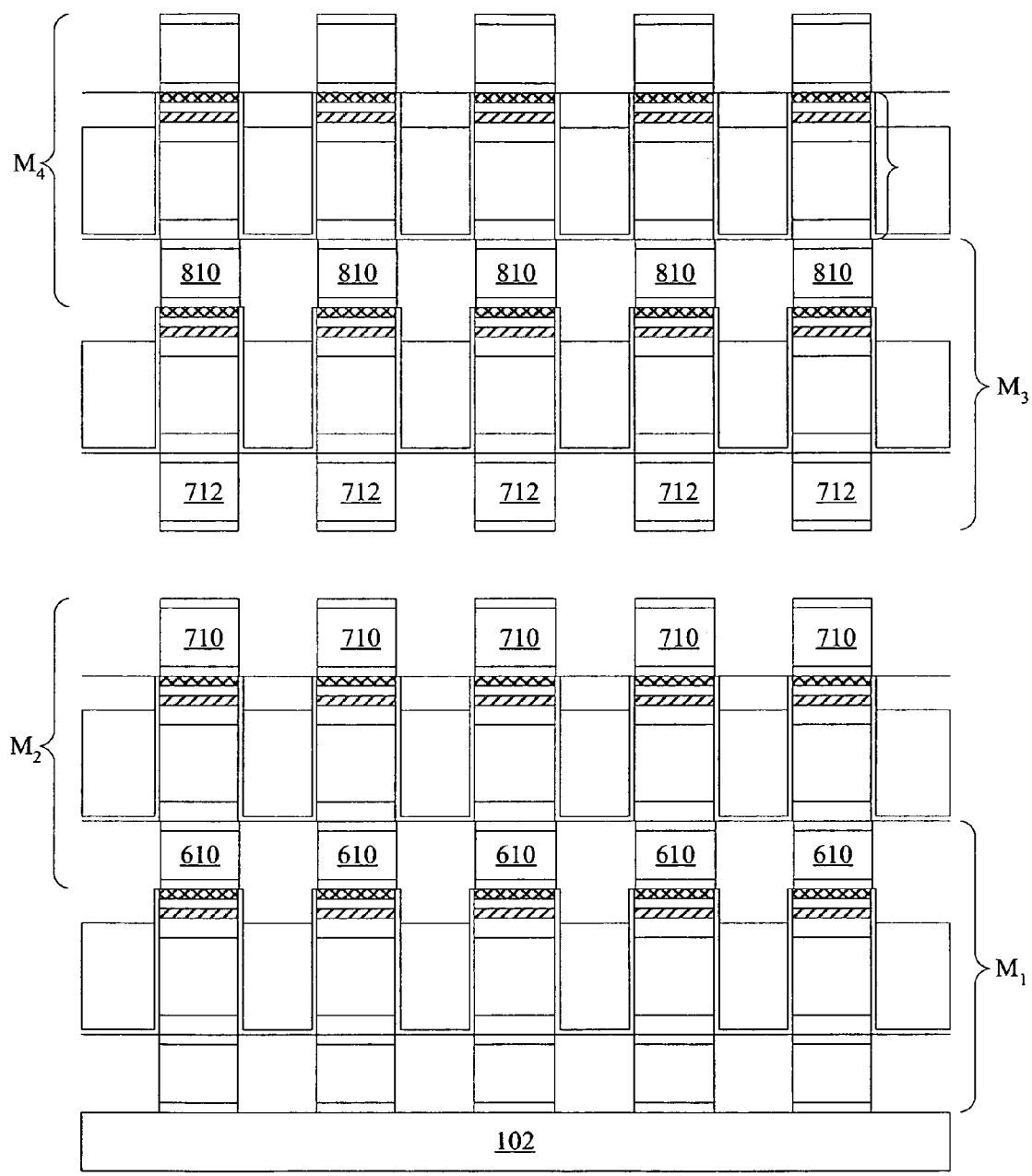
FIG. 7b is a cross-sectional view illustrating two memory levels not sharing data lines according to a different embodiment.

Additional memory levels can be formed above the first two memory levels pictured in FIG. 6. Data lines can be shared as well, or they can be separate. FIG. 7a shows four memory levels: Memory levels $M_1$ and $M_2$ share reference lines 610, memory levels $M_2$ and $M_3$ share data lines 710, and memory levels $M_3$ and $M_4$ share reference lines 810. FIG. 7b shows four memory levels in which reference lines (610 and 810) are shared, but data lines (710 and 712) are not shared between the memory levels $M_2$ and $M_3$. The arrangement of FIG. 7a requires fewer masking steps, and may be preferable for that reason.

In most preferred embodiments, control circuitry is formed in the substrate beneath the memory, and electrical connections must be made from the ends of the data lines, reference lines, and select lines of the array to this circuitry. Advantageous schemes for making these connections while minimizing use of substrate area are described in Scheuerlein et al., U.S. Pat. No. 6,879,505, "Word line arrangement having multi-layer word line segments for three-dimensional memory array"; and in Scheuerlein et al., U.S. patent application Ser. No. 10/403,752, "Three-Dimensional Memory Device Incorporating Segmented Bit Line Memory Array," filed Mar. 31, 2003, both owned by the assignee of the present invention and hereby incorporated by reference. The arrangement of FIG. 7b, while requiring more masking steps, can make use of the techniques described by Scheuerlein et al., and my be preferred for that reason.

Both of the embodiments described include a nonvolatile memory cell comprising a switchable resistor memory element; and a transistor comprising a channel region, the switchable resistor memory element and the transistor arranged in series, wherein the transistor is electrically connected between a data line and a reference line, both data line and reference line extending in a first direction, wherein, when the transistor is on, current flows through the channel region in a second direction, the second direction substantially perpendicular to the first direction, wherein the switchable resistor memory element decreases resistance when subjected to a set voltage magnitude and increases resistance when subjected to a reset voltage magnitude, and wherein polarity of the set voltage magnitude and the reset voltage magnitude are opposite.

Circuit Considerations

In the memory arrays of the present invention, data lines and reference lines are parallel and are preferably perpendicular to select lines. This is advantageous because many cells can be selected by a select line. All of these cells have some current activity, and if a reference line were parallel to such a select line, all those currents would pass through the reference line, and the I-R drop would be multiplied many times.

In preferred embodiments of the present invention the data line and reference line are perpendicular to the direction of current flow through the channel of the transistor. DRAM devices having a similar configuration are described in Scheuerlein, U.S. patent application Ser. No. 11/157,293, "Floating Body Memory Cell System and Method of Manufacture," and in Scheuerlein, U.S. patent application Ser. No. 11/157,317, "Volatile Memory Cell Two-Pass Writing Method," both filed Jun. 20, 2005 and both hereby incorporated by reference.

Resistance across the thin film transistor of the present invention is important to device performance. For reasons described more fully in the related applications filed on even date herewith, it is preferable for the resistance of the thin film transistor to comparable to the low-resistance state of the switchable resistor memory element. In the memory cell of the present invention, resistance of the channel region is decreased by use of germanium or silicon-germanium alloys. Similarly, use of very thin gate dielectrics and of high-K dielectric gate materials helps keep resistance of the transistor low.

The set voltage magnitude and the reset voltage magnitude used in the present invention in general are less than about 2 volts, preferably less than about 1 volt.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Embodiments of the present invention include a monolithic three dimensional memory array comprising: a) a first memory level formed above a substrate, the first memory level comprising a first plurality of memory cells, each first memory cell comprising: i) a field effect transistor; and ii) a switchable resistor memory element, wherein the switchable resistor memory element decreases resistance when subjected to a set voltage magnitude and increases resistance when subjected to a reset voltage magnitude, and wherein polarity of the set voltage magnitude and the reset voltage magnitude are opposite; and b) a second memory level monolithically formed above the first memory level. In preferred embodiments the second memory level comprises a second plurality of memory cells.

Because memory cells are formed above a substrate, first, second, and additional pluralities of switchable resistor memory elements may be formed at different heights above a substrate.

Embodiments of the present invention provide for a method for forming, setting and resetting a nonvolatile memory cell and associated conductors, the method comprising: forming a first data line extending in a first direction; forming a first reference line extending in the first direction; forming a thin film transistor having a channel region, the channel region disposed electrically between the first data line and the first reference line; forming a switchable resistor memory element disposed between the channel region and the data line, the resistive switching memory element having a first resistance; forming a first select line extending in a second direction different from the first direction; applying a set voltage magnitude across the switchable resistor memory element wherein, after application of the set voltage magnitude, the switchable resistor memory element has a second resistance lower than the first resistance; and applying a reset voltage magnitude across the switchable resistor memory element wherein, after application of the reset voltage magnitude, the switchable resistor memory element has a third resistance higher than the second resistance, and wherein the polarity of the set voltage magnitude and the reset voltage magnitude are opposite. While applying the set voltage magnitude, current flows between the first data line and the first reference line through the channel region and through the switchable resistor memory element.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory cell comprising:
a switchable resistor memory element; and
a thin film transistor having a channel region,
wherein both a reference line and a data line are disposed below the channel region of the thin film transistor,
wherein the switchable resistor memory element is disposed in series with the thin film transistor,
wherein the switchable resistor memory element decreases resistance when a set voltage magnitude is applied across the switchable resistor memory element, and
wherein the switchable resistor memory element increases resistance when a reset voltage magnitude is applied across the switchable resistor memory element, and
wherein the polarity of the set voltage magnitude is opposite the polarity of the reset voltage magnitude.

2. The nonvolatile memory cell of claim 1 wherein the switchable resistor memory element comprises a perovskite material.

3. The nonvolatile memory cell of claim 1 wherein the switchable resistor memory element comprises amorphous silicon doped with an element selected from the group consisting of V, Co, Ni, Pd, Fe, and Mn.

4. The nonvolatile memory cell of claim 1 wherein the switchable resistor memory element comprises a carbon-polymer film.

5. The nonvolatile memory cell of claim 1 wherein the switchable resistor memory element comprises a solid electrolyte material.

6. The nonvolatile memory cell of claim 5 wherein the solid electrolyte material comprises chalcogenide glass having the formula $A_xB_y$,
   wherein A is selected from the group consisting of B, Al, Ga, In, Ti, C, Si, Ge, Sn, Pb, N, P, As, Sb, Bi, F, Cl, Br, I and At and
   wherein B is Si, Se, Te, or alloys or compounds thereof.

7. The nonvolatile memory cell of claim 6 wherein the chalcogenide glass is doped with Ag, Au, Pt, Cu, Cd, Ir, Ru, Co, Cr, Mn or Ni.

8. The nonvolatile memory cell of claim 5 wherein a reservoir of mobile metal ions is in contact with the solid electrolyte material.

9. The nonvolatile memory cell of claim 1 wherein the transistor and switchable resistor memory element are electrically disposed between the data line and the reference line, the reference line substantially parallel to the data line.

10. The nonvolatile memory cell of claim 9 wherein the transistor is connected to a select line, the select line substantially perpendicular to the data line, wherein the select line controls the thin film transistor.

11. The nonvolatile memory cell of claim 10 wherein the channel region is not substantially vertical, and the data line and the reference line are substantially coplanar.

12. The nonvolatile memory cell of claim 11 wherein the switchable resistor memory element is disposed between the channel region and the data line.

13. The nonvolatile memory cell of claim 1 wherein the channel region comprises silicon, germanium or a germanium alloy.

14. The nonvolatile memory cell of claim 1 wherein the channel region is polycrystalline.

15. The nonvolatile memory cell of claim 1 wherein the set voltage magnitude is less than about 2 volts.

16. The nonvolatile memory cell of claim 1 wherein the reset voltage magnitude is less than about 2 volts.

17. The nonvolatile memory cell of claim 1 wherein the cell is a portion of a monolithic three dimensional memory array formed above a substrate.

18. The nonvolatile memory cell of claim 17 wherein the substrate comprises monocrystalline silicon.

19. The nonvolatile memory cell of claim 1 further comprising a select line extending perpendicular to the data line and to the reference line.

20. The nonvolatile memory cell of claim 19 wherein:
   a gate electrode of the thin film transistor is electrically connected to or comprises a portion of the select line,
   one of a source region or a drain region of the thin film transistor is formed directly on the data line and is electrically connected to the data line,
   the switchable resistor memory element is electrically connected to the reference line and to the other one of the source region or the drain region of the thin film transistor, and
   the data line extends parallel to the reference line.

21. The nonvolatile memory cell of claim 1 wherein the source region to the drain region direction in the thin film transistor is perpendicular to the direction of the data line and the reference line.

22. A nonvolatile memory cell comprising:
   a switchable resistor memory element,
   a thin film transistor having a channel region, a source region, a drain region and a gate electrode,
   a select line,
   a data line disposed below the channel region, and a reference line disposed below the channel region,
   wherein:
      the gate electrode of the thin film transistor is electrically connected to or comprises a portion of the select line,
      one of the source region or the drain region of the thin film transistor is electrically connected to the data line,
      the switchable resistor memory element is electrically connected to the reference line and to the other one of the source region or the drain region of the thin film transistor,
      the select line extends perpendicular to the data line and to the reference line,
      the data line extends parallel to the reference line,
      the switchable resistor memory element is disposed in series with the thin film transistor,
      the switchable resistor memory element decreases resistance when a set voltage magnitude is applied across the switchable resistor memory element, and
      the switchable resistor memory element increases resistance when a reset voltage magnitude is applied across the switchable resistor memory element, and wherein the polarity of the set voltage magnitude is opposite the polarity of the reset voltage magnitude.

23. The nonvolatile memory cell of claim 22 wherein the switchable resistor memory element comprises a perovskite material.

24. The nonvolatile memory cell of claim 22 wherein the switchable resistor memory element comprises amorphous silicon doped with an element selected from the group consisting of V, Co, Ni, Pd, Fe, and Mn.

25. The nonvolatile memory cell of claim 22 wherein the switchable resistor memory element comprises a carbon-polymer film.

26. The nonvolatile memory cell of claim 22 wherein the switchable resistor memory element comprises a solid electrolyte material.

27. The nonvolatile memory cell of claim 26 wherein the solid electrolyte material comprises chalcogenide glass having the formula $A_xB_y$,
   wherein A is selected from the group consisting of B, Al, Ga, In, Ti, C, Si, Ge, Sn, Pb, N, P, As, Sb, Bi, F, Cl, Br, I and At, wherein B is Si, Se, Te, or alloys or compounds thereof, and
wherein the chalcogenide glass is doped with Ag, Au, Pt, Cu, Cd, Ir, Ru, Co, Cr, Mn or Ni.

28. The nonvolatile memory cell of claim 26 wherein a reservoir of mobile metal ions is in contact with the solid electrolyte material.

29. The nonvolatile memory cell of claim 22 wherein the cell is a portion of a monolithic three dimensional memory array formed above a substrate.

30. The nonvolatile memory cell of claim 22 wherein the source region to the drain region direction in the thin film transistor is perpendicular to the direction of the data line and the reference line.

31. The nonvolatile memory cell of claim 22 wherein one of the source region or the drain region of the thin film transistor is formed directly on the data line.

\* \* \* \* \*